United States Patent [19]

Nagano et al.

[11] Patent Number: 5,652,171
[45] Date of Patent: Jul. 29, 1997

[54] METHOD OF MANUFACTURING SEMICONDUCTOR DEVICE HAVING CAPACITOR

[75] Inventors: Yoshihisa Nagano; Eiji Fujii, both of Osaka, Japan

[73] Assignee: Matsushita Electronics Corporation, Osaka, Japan

[21] Appl. No.: 594,945

[22] Filed: Jan. 31, 1996

[30] Foreign Application Priority Data

Feb. 3, 1995 [JP] Japan ................................ 7-016829

[51] Int. Cl.⁶ .............................. H01L 21/70; H01L 27/00
[52] U.S. Cl. .............................. 437/60; 437/919; 437/52
[58] Field of Search ....................... 437/60, 52, 919

[56] References Cited

U.S. PATENT DOCUMENTS

| | | | |
|---|---|---|---|
| 5,216,572 | 6/1993 | Larson et al. | 437/60 |
| 5,335,138 | 8/1994 | Sandhu et al. | 437/60 |
| 5,527,729 | 6/1996 | Matsumoto et al. | 437/60 |

FOREIGN PATENT DOCUMENTS

| | | |
|---|---|---|
| 2-151031 | 6/1990 | Japan. |
| 3-155621 | 7/1991 | Japan. |
| 4-67636 | 3/1992 | Japan. |
| 6-49667 | 2/1994 | Japan. |

*Primary Examiner*—Jey Tsai
*Attorney, Agent, or Firm*—McDermott, Will & Emery

[57] ABSTRACT

A platinum bottom electrode film, a dielectric film composed of a high permittivity dielectric material or a ferroelectric material, and a platinum top electrode film are formed on a substrate on which circuit elements and wiring are formed, and the platinum top electrode film and the dielectric film are selectively dry-etched by using etching gas containing chlorine, then plasma generated by discharging gas containing fluorine is irradiated. By this method of manufacturing a semiconductor device including a capacitor, there is almost no residual chlorine, and hence erosion of the dielectric film by residual chlorine is prevented.

7 Claims, 3 Drawing Sheets

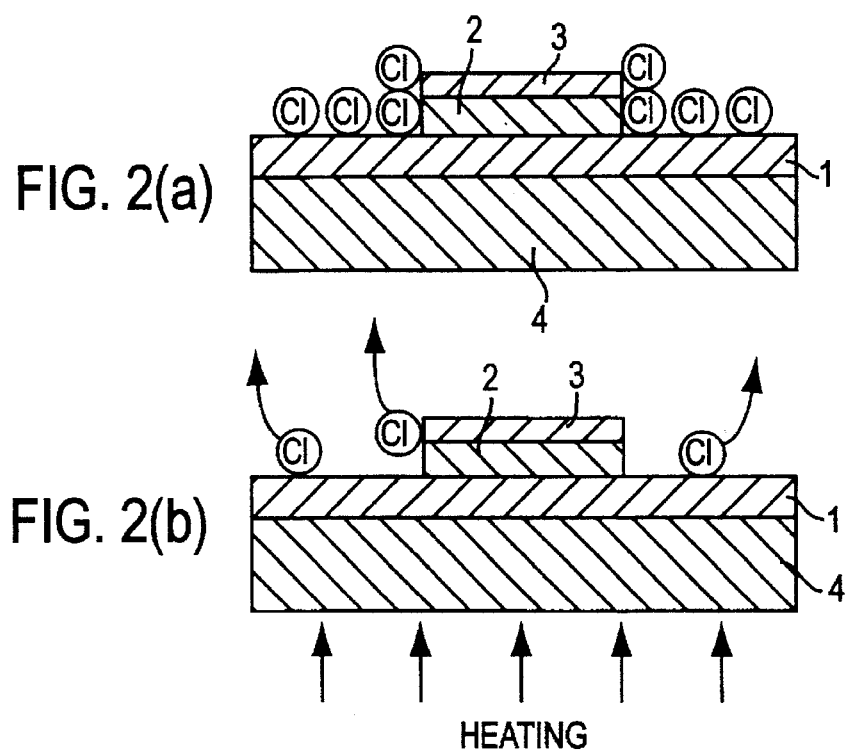
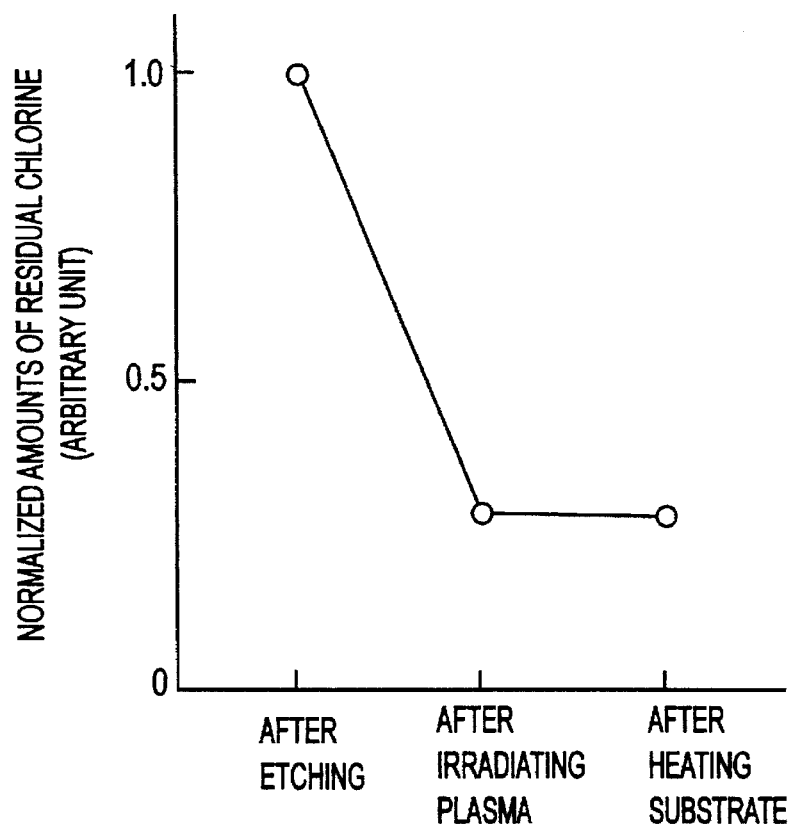

METHOD OF MANUFACTURING SEMICONDUCTOR DEVICE HAVING CAPACITOR

BACKGROUND OF THE INVENTION

The present invention relates to a method of manufacturing a semiconductor device having a capacitor using a high permittivity dielectric film or a ferroelectric film as a capacitor dielectric film, and in particular, to a method including a step of dry etching of the capacitor dielectric film.

Recently, efforts are concentrated on development of a microcomputer incorporating a capacitor using a high permittivity dielectric film or a ferroelectric film, being effective as measures for decreasing extraneous emission which is an electromagnetic noise, and a ferroelectric nonvolatile RAM capable of operating at low voltage and writing/reading at high speed. Etching of these capacitor dielectric films has been done by wet etching as isotropic etching or non-selective ion milling. In these methods, however, high processing accuracy and high etching selectivity cannot be realized, and hence dry-etching technique is lately researched and developed intensively. The etching gas used in dry-etching of capacitor dielectric films and electrodes is halogen represented by chlorine or its compound. For example, chlorine alone, hydrogen chloride and carbon chloride have been reported.

A conventional method of manufacturing a semiconductor device is described below by referring to drawings. FIG. 4(a), FIG. 4(b), FIG. 4(c), and FIG. 4(d) are sectional views for explaining the method of forming a capacitor included in a conventional semiconductor device.

First, as shown in FIG. 4(a), a platinum bottom electrode film 1, a dielectric film 2 comprised of a high permittivity dielectric film or a ferroelectric film, and a platinum top electrode film 3 are formed on a substrate 4 on which a silicon oxide film is deposited. Then, using a photoresist film 5 as mask, the platinum top electrode film 3 and the dielectric film 2 are dry-etched by using etching gas containing chlorine and processed into a shape as shown in FIG. 4(b). Finally, by dry-etching the platinum bottom electrode film 1, a capacitor is formed.

In this conventional manufacturing method, however, a defect 8 be formed in a side wall 6 of the dielectric film 2 as shown in FIG. 4(c) or the side wall 6 is often degenerated into a difference substance 9 from the dielectric. When such state appears, short circuit of capacitor or increase of leakage current occurs, and the function as the capacitor is lost in an extreme case.

The cause of appearance of such phenomenon may be considered as follows. On the side walls 6 of the platinum top electrode film 3 and the dielectric film 2 which are dry-etched, and on the surface 7 of the platinum bottom electrode film 1 which is exposed, atoms, ions or radicals of chlorine generated by decomposition of the etching gas due to discharge are massively deposited. These chlorine atoms, ions or radicals easily react with moisture to form an acidic aqueous solution, that is, hydrochloric acid. The side wall 6 of the dielectric film 2 composed of a dielectric oxide violently reacts with this hydrochloric acid, and the dielectric film 2 is eroded, or degenerated into other substance 9 different from the dielectric. As a result, it is considered to lead to short circuit of capacitor, increase of leakage current, or loss of function as capacitor.

This adsorption of moisture occurs always in operation in the manufacturing process of a semiconductor device such as exposure of substrate to the atmosphere or washing in water, and is hence inevitable. Such inconvenience is also noted when using bromine or iodine as etching gas.

SUMMARY OF THE INVENTION

An object of the present invention is to provide a method of manufacturing a semiconductor device capable of preventing erosion of dielectric film, and suppressing occurrence of short circuit of capacitor and increase of leakage current.

According to an aspect of the invention, a method of manufacturing a semiconductor device comprises a step of forming a platinum bottom electrode film, a dielectric film, and a platinum top electrode film on a substrate on which circuit elements and wiring are formed, a step of dry-etching selectively the platinum top electrode film and the dielectric film by using etching gas containing at least one of chlorine, bromine and iodine, a step of irradiating plasma generated by discharging gas containing fluorine after the step of dry-etching, and a step of etching the platinum bottom electrode film.

According to other aspect of the invention, a method of manufacturing a semiconductor device comprises a step of forming a platinum bottom electrode film, a dielectric film, and a platinum top electrode film on a substrate on which circuit elements and wiring are formed, a step of dry-etching selectively the platinum top electrode film and the dielectric film by using etching gas containing at least one of chlorine, bromine and iodine, a step of heating the substrate after the step of dry-etching, and a step of etching the platinum bottom electrode film.

By the plasma irradiating or heating process after dry-etching, decomposition products of the etching gas containing chlorine, bromine or iodine depositing on the side wall of the dielectric film or on the surface of the platinum bottom electrode film at the time of dry-etching are extremely decreased. It hence suppresses occurrence of defect or degeneration of the dielectric film which is induced by reacting the dielectric film with the acid formed by reaction of these decomposition products with moisture dielectric. Therefore occurrence of short circuit in capacitor and increase Of leakage current maybe extremely suppressed.

BRIEF DESCRIPTION OF THE DRAWINGS

FIG. 2(a) and FIG. 2(b) are sectional views for explaining a method of forming a capacitor incorporated in a semiconductor device in a second embodiment of the invention.

FIG. 3 is a comparative diagram of residual chlorine amount on the substrate in the first and second embodiments of the invention and a prior art.

DESCRIPTION OF THE PREFERRED EMBODIMENTS

Figure 1A:
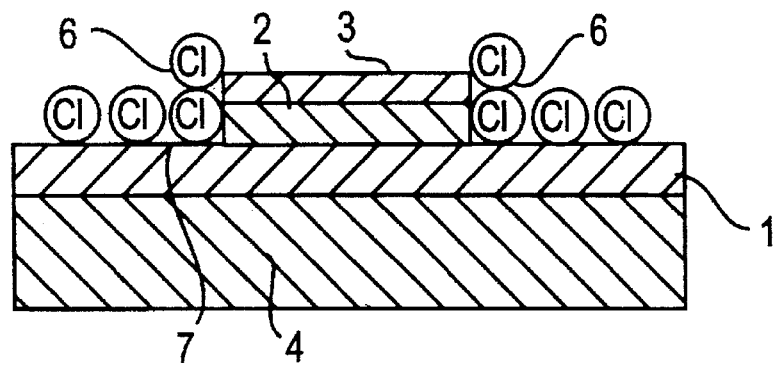
FIG. 1(a), FIG. 1(b), and FIG. 1(c) are sectional views for explaining a method of forming a capacitor incorporated in a semiconductor device in a first embodiment of the invention.

The first embodiment of the invention is described below while referring to FIG. 1(a), FIG. 1(b), and FIG. 1(c). Same parts as in prior art shown in FIG. 4(a), FIG. 4(b), FIG. 4(c), and FIG. 4(d) are identified with same reference numerals.

First, same as in the conventional method, a platinum bottom electrode film 1, a dielectric film 2 composed of a high permittivity dielectric material or a ferroelectric material, and a platinum top electrode film 3 are formed on a substrate 4 on which circuit elements, wiring and an insulating film are formed. Next, as shown in FIG. 1(a), using an etching gas containing chlorine, with a photoresist film (not shown) as mask, the platinum top electrode film 3 and the dielectric film 2 are selectively dry-etched. Consequently, as shown in FIG. 1(b), plasma generated by discharging carbon tetrafluoride gas is irradiated to the substrate 4. At this time, the fluorine plasma obtained by discharge under the irradiating conditions of carbon tetrafluoride of 50 sccm, pressure of 1 Torr and RF power of 100 W load is irradiated for 30 seconds. Then the platinum bottom electrode film 1 is selectively dry-etched, and the capacitor are formed into a specified shape.

In thus manufactured semiconductor device, defect and degeneration in the side wall 6 of the capacitor observed in the prior art were hardly noted. As a result of investigation into the rate of occurrence of short circuits in this semiconductor device, a short circuit was observed only in one out of 50 pieces, and the short circuit incidence was extremely decreased to about one-tenth or less of the prior art. Besides, increase of leakage current was not detected.

As the gas used in plasma irradiating, aside from the $CF_4$ above, it is preferred to use $CHF_3$, $NF_3$, $XeF_2$, and $SF_6$, and mixture of at least two of these gases. In particular, $CF_4$ and $NF_3$ gases are outstanding in the effects for preventing short circuit and suppressing increase of leakage current, and are hence preferred.

The reason of suppression of occurrence of short circuit or increase of leakage current by plasma irradiating is not clearly explained yet. At least, however, from the results of measurement of residual chlorine concentration shown in FIG. 3, the following maybe said. In FIG. 3, incidentally, the residual chlorine concentration after plasma irradiating is expressed as a relative value in comparison with the residual chlorine concentration right after dry-etching by etching gas containing chlorine. The residual chlorine concentration after plasma irradiating corresponds to the irradiating conditions shown in the first embodiment. The residual chlorine concentration after plasma irradiating is decreased to about one-third of the residual chlorine concentration right after dry-etching.

Figure 1B:
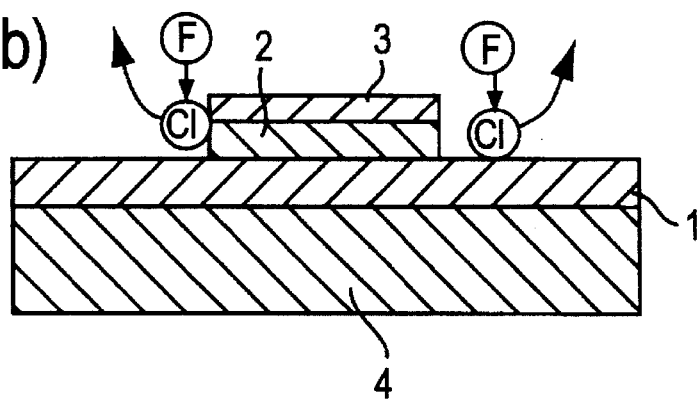
Figure 1C:
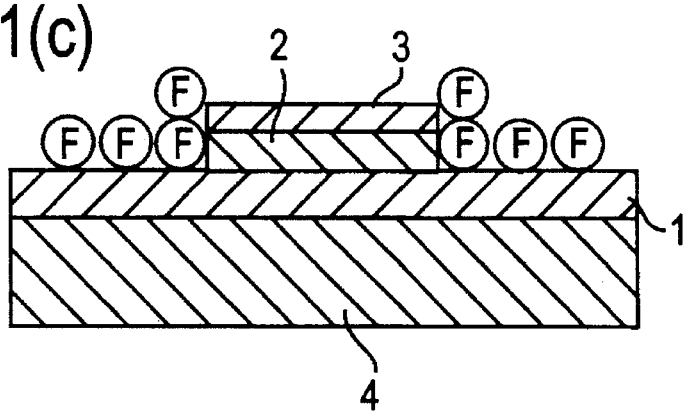
Figure 4A:
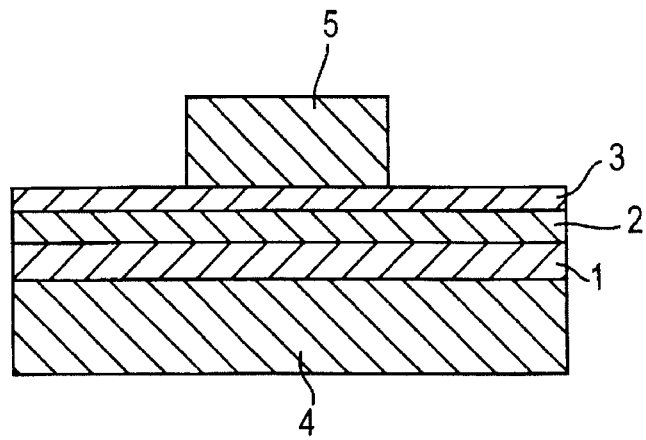
FIG. 4(a), FIG. 4(b), FIG. 4(c), and FIG. 4(d) are sectional views for explaining a conventional method of forming a capacitor incorporated in a semiconductor device.
Figure 4B:
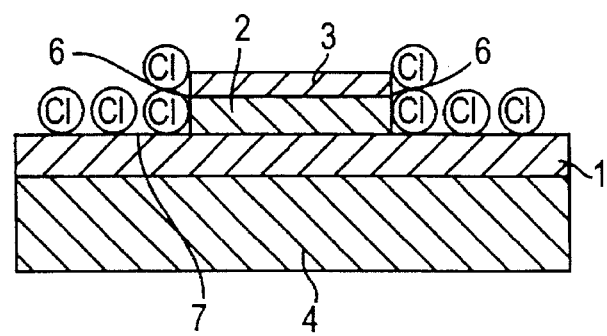
Figure 4C:
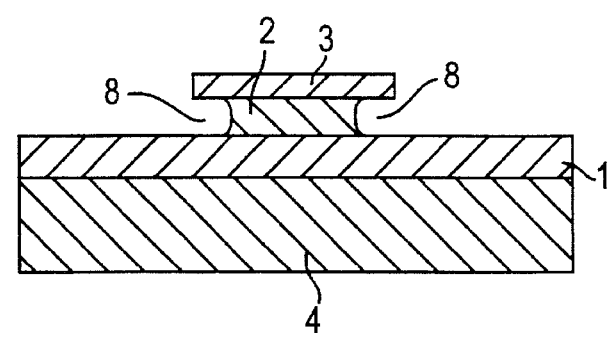
Figure 4D:
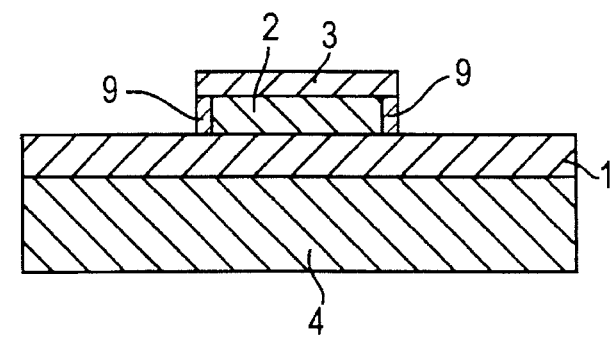

At the time of dry-etching by using etching gas containing chlorine, as shown in FIG. 1(a), decomposition products such as chlorine atoms, ions and radicals formed by decomposition of the etching gas by discharge are massively deposited on the side walls 6 of the platinum top electrode film 8 and the dielectric film 2, and on the surface 7 of the platinum bottom electrode film 1 exposed by etching. Consequently, when the plasma generated by discharging the gas containing fluorine is irradiated, as shown in FIG. 1(b), the decomposition products are replaced by fluorine. In this case, since the chlorine is not strongly bonded with the platinum or dielectric on the side wall 6, the chlorine maybe easily removed by irradiating an active fluorine plasma. Then, as shown in FIG. 1(c), the side wall 6 and the surface of the platinum bottom electrode film 1 are covered with fluorine.

The role of the fluorine is not clarified. It is considered, among others, that the fluorine hardly reacts with moisture and hardly generates hydrofluoric acid, or hardly reacts with oxide dielectric, or reacts with oxide dielectric to form an inactive form on the surface which prevents reaction from propagating into the dielectric. Any way, the fluorine after plasma irradiating is considered to play a role in prevention of occurrence of defect or degeneration in the side wall of the dielectric film.

The second embodiment of the invention is described below by reference to FIG. 2(a) and FIG. 2(b). First, as shown in FIG. 2(a), same as in the first embodiment, the platinum top electrode film 3 and the dielectric film 2 are dry-etched. Next, as shown in FIG. 2(b), holding in nitrogen atmosphere same as the atmospheric pressure, the substrate is heated for 60 seconds at a temperature of 180° C. Afterwards, the platinum bottom electrode film 1 is selectively dry-etched, and the capacitor is formed into a specified shape. By this method of heating after dry-etching, too, nearly the same effects of prevention of occurrence of short circuit and suppression of increase of leakage current as in the first embodiment were obtained.

To obtain such prominent effects, it is preferred to heat at a temperature range from 150° C. to a temperature not to cause substantial change in the characteristics of the semiconductor device. More specifically, in an inert atmosphere, it is preferred to heat at a temperature between 150° C. and 450° C. As heating atmosphere, aside from the nitrogen gas, argon gas, helium gas or other inert gas may be used, or it maybe also done in vacuum.

The reason of effect caused by heating is estimated as follows from the results of measurement of residual chlorine concentration shown in FIG. 3. The residual chlorine concentration after heating process shown in FIG. 3 corresponds to the case of heating conditions shown in the second embodiment. The residual chlorine concentration after heating process is decreased to about one-third as compared with the residual chlorine concentration right after dry-etching.

As shown in FIG. 2(b), massive deposits of chlorine atoms, ions or radicals on the side wall 6 or surface 7 of the platinum bottom electrode film 1 are easily detached by giving thermal energy to the substrate 4 because the chlorine is not strongly bonded with the platinum or dielectric on the side wall 6. Accordingly, the residual chlorine which reacts with moisture to produce hydrochloric acid is extremely decreased. Therefore, defect or degeneration of the dielectric film 2 hardly occurs, thereby suppressing formation of short circuit and increase of leakage current.

The invention is not limited to the illustrated embodiments alone, but may be modified in various forms. For example, in the foregoing embodiments, gas containing chlorine is used as etching gas, but the same effects as in the embodiments are obtained by using etching gas containing bromine or iodine, instead of chlorine, or etching gas containing two or more of chlorine, bromine and iodine. Therefore, all modified examples existing in the true spirit and scope of the invention are included in the scope of the claims.

What is claimed is:

1. A method of manufacturing a semiconductor device comprising:

a step of forming a platinum bottom electrode film, a dielectric film composed of a high permittivity dielectric material or a ferroelectric material, and a platinum top electrode film on a substrate on which circuit elements and wiring are formed;

a step of dry-etching selectively said platinum top electrode film and said dielectric film by using etching gas containing at least one of chlorine, bromine and iodine;

a step of irradiating plasma generated by discharging gas containing fluorine after said step of dry-etching; and a step of etching said platinum bottom electrode film.

2. The method of claim 1, wherein said step of irradiating plasma is to replace decomposition products of said etching gas depositing on a side wall of said platinum top electrode film and said dielectric film and on a surface of said platinum bottom electrode film exposed by said step of dry-etching, with fluorine.

3. The method of claim 1, wherein said gas containing fluorine is at least one of carbon tetrafluoride, methane trifluoride, nitrogen trifluoride, xenon fluoride and sulfur hexafluoride.

4. A method of manufacturing a semiconductor device comprising:

a step of forming a platinum bottom electrode film, a dielectric film composed of a high permittivity dielectric material or a ferroelectric material, and a platinum top electrode film on a substrate on which circuit elements and wiring are formed;

a step of dry-etching selectively said platinum top electrode film and said dielectric film by using etching gas containing at least one of chlorine, bromine and iodine;

a step of heating said substrate after said step of dry-etching; and a step of etching said platinum bottom electrode film.

5. The method of claim 4, wherein said heating step is done in a temperature range from 150° C. to a temperature not causing substantial charge in the characteristics of said semiconductor device.

6. The method of claim 4, wherein said heating step is done in a temperature range from 150° C. to 450° C.

7. The method of claim 4, wherein said heating step is done in an inert gas atmosphere or in vacuum.

* * * * *

UNITED STATES PATENT AND TRADEMARK OFFICE
CERTIFICATE OF CORRECTION

PATENT NO. : 5,652,171
DATED : July 29, 1997
INVENTOR(S) : Yoshihisa NAGANO et al.

It is certified that error appears in the above-indentified patent and that said Letters Patent is hereby corrected as shown below:

Col. 6, line 8, delete "charge" and insert --change--.

Signed and Sealed this

Fourteenth Day of April, 1998

Attest:

BRUCE LEHMAN

Attesting Officer

Commissioner of Patents and Trademarks